(12) United States Patent
Usui

(10) Patent No.: US 6,240,495 B1
(45) Date of Patent: May 29, 2001

(54) MEMORY CONTROL SYSTEM AND MEMORY CONTROL METHOD

(75) Inventor: Minoru Usui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/203,664

(22) Filed: Dec. 1, 1998

(30) Foreign Application Priority Data

May 12, 1998 (JP) .................................................. 10-129066

(51) Int. Cl.[7] .................................................. G06F 12/00
(52) U.S. Cl. ..................... 711/167; 711/163; 711/105; 711/111; 365/189.05; 365/230.08; 365/233; 365/194; 710/129; 713/503
(58) Field of Search ..................................... 711/167, 163, 711/105, 111; 365/189.05, 230.08, 233, 194; 710/129; 709/400; 713/502, 503

(56) References Cited

U.S. PATENT DOCUMENTS 5,787,457 * 7/1998 Miller et al. .......................... 711/105
5,910,181 * 6/1999 Hatakenaka et al. ................. 714/718
6,009,039 * 12/1999 Takemae et al. ..................... 365/233
6,034,916 * 3/2000 Lee ........................................ 365/233

* cited by examiner

Primary Examiner—Do Hyun Yoo
Assistant Examiner—Vu A. Pham
(74) Attorney, Agent, or Firm—Arent Fox Kintner Plotkin & Kahn, PLLC

(57) ABSTRACT

A memory control system employing at least one clock synchronous memory which is controlled by a memory control unit includes an interface circuit. The interface circuit functions as an output buffer synchronous with a clock. Thus, the interface circuit holds a memory control signal, which is output from the memory control unit for controlling the memory, and transmits the memory control signal to the memory in the predetermined time. In this configuration, access to the memory is made in consideration of the delay time required for a memory control signal to reach the memory via the interface circuit. Preferably, the presence or absence of the interface circuit for holding a memory control signal is determined based on an operation mode in which the memory control unit is established. Further proposed is a memory control method for controlling at least one clock synchronous memory which is implemented in the memory control system.

4 Claims, 11 Drawing Sheets

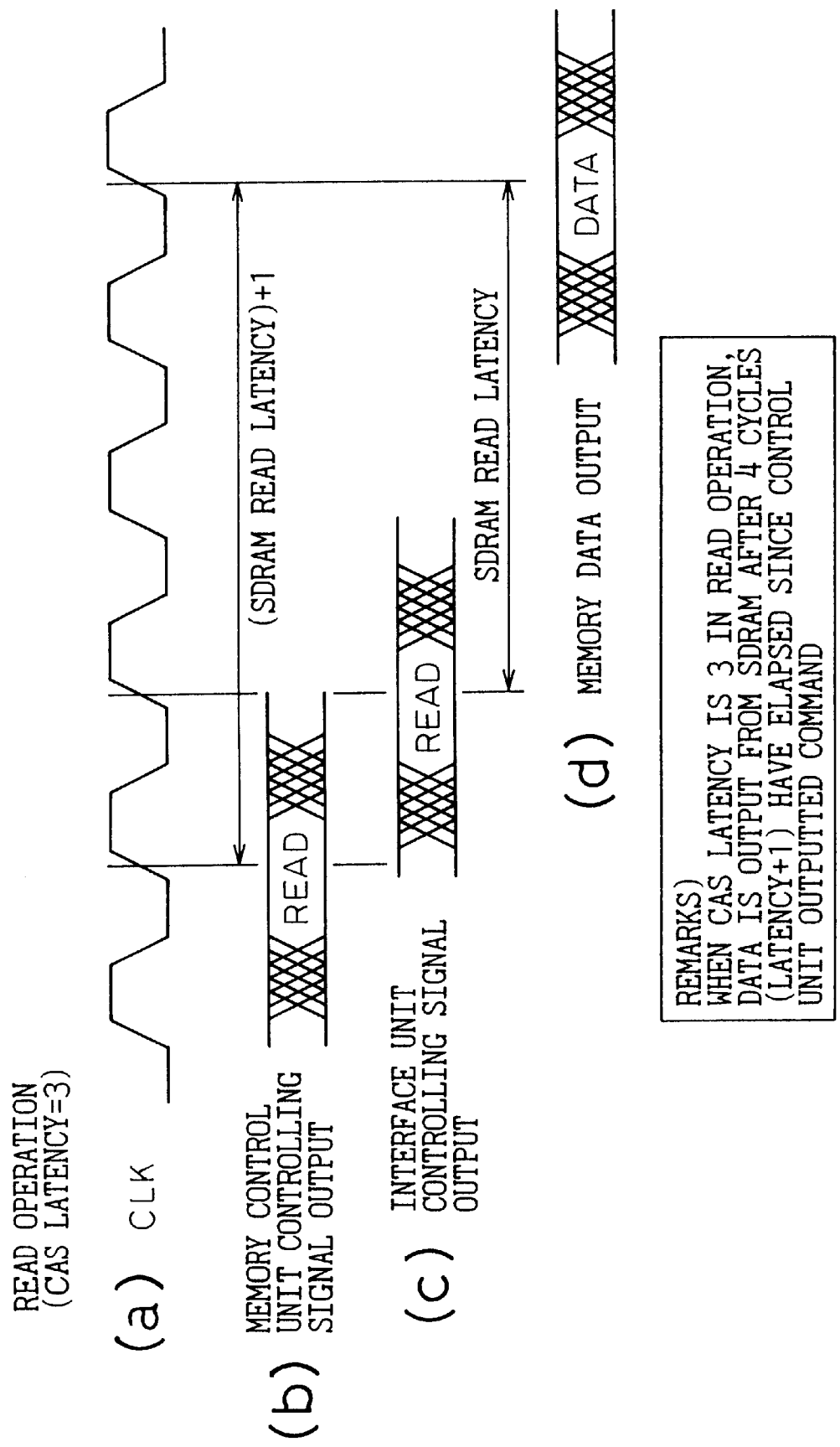

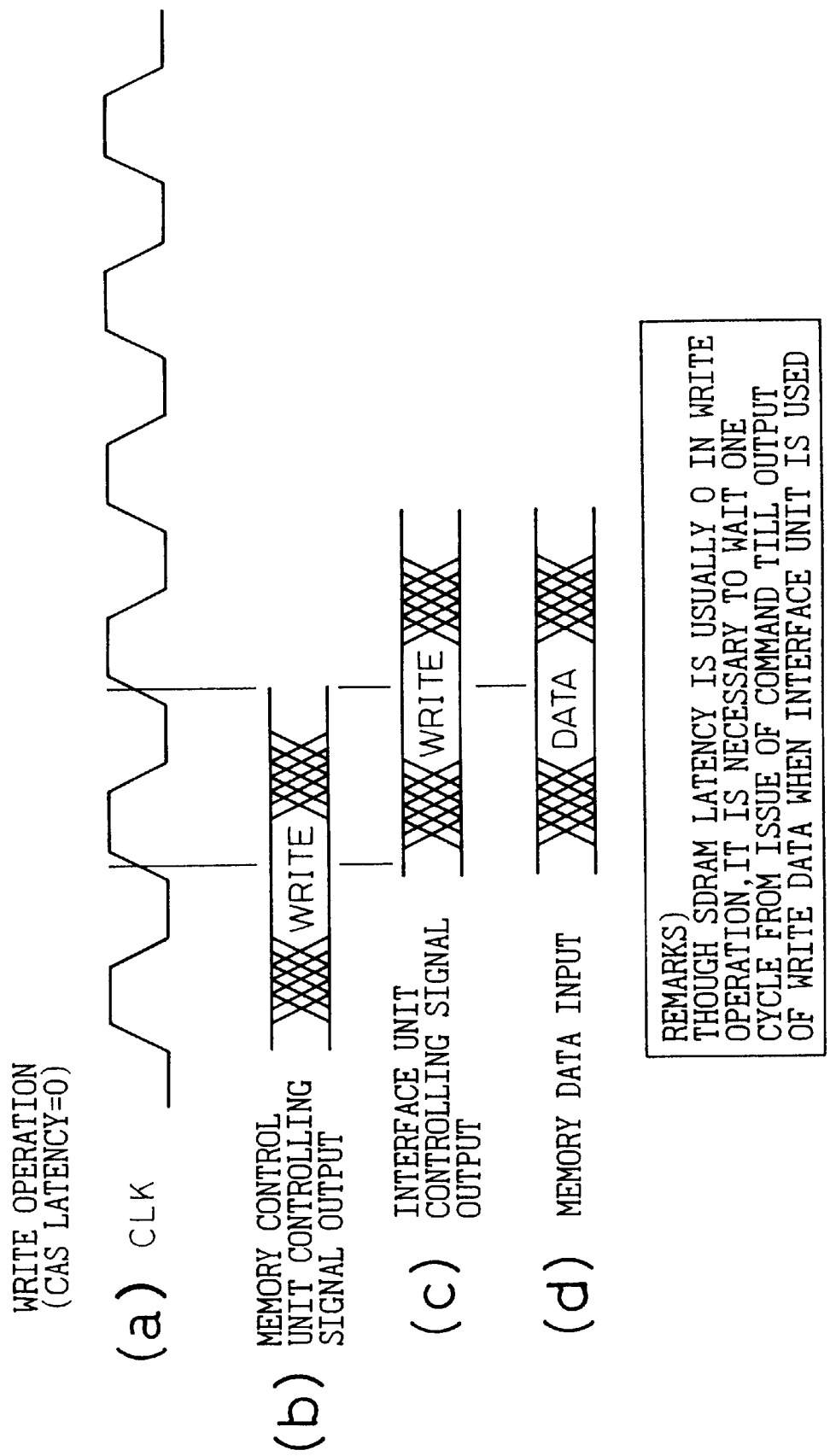

MEMORY CONTROL SYSTEM AND MEMORY CONTROL METHOD

BACKGROUND OF THE INVENTION

1. Field of the Invention

The present invention relates to a memory control system employing at least one clock synchronous memory which is controlled by a memory control unit or the like, and to a memory control method for controlling the clock synchronous memory. More particularly, this invention is concerned with a memory control system and memory control method in which, when numerous memories must be provided in order to secure a memory space for a large storage capacity, access to the numerous memories can be made quickly.

In recent years, a capability of a microprocessor (usually abbreviated to MPU (microprocessor unit)) for processing various data has improved remarkably. A storage unit (or memory circuit) which is to be included in a system employing such a microprocessor is likely to be required to have a large storage capacity and to be quickly accessible. With regard to a memory or memories constituting a storage unit satisfying the above requirement, a novel DRAM such as a synchronous dynamic random access memory operating synchronously with a clock (hereinafter abbreviated to SDRAM) has been developed. The SDRAM operates synchronously with a high-frequency clock having a frequency equal to 100 MHz or more than 100 MHz and can input or output data requested by the microprocessor or the like.

A memory control unit including a microprocessor is designed to control the SDRAM. An idea of a maximum driving capacity to drive a memory is discussed with regard to the memory control unit. A value indicating the maximum driving capacity generally restricts the number of SDRAMs that can be connected to the memory control unit. Owing to the restriction in the number of SDRAMs and a storage capacity of each SDRAM which is to be employed, the total capacity that can be provided as a system is determined. However, available types of SDRAMs are limited to some types. For realizing the system having a large storage capacity by using these SDRAMs, it is necessary to increase the number of SDRAMs which are to be employed.

2. Description of the Related Art

For better understanding of the problems underlying memory control systems according to the prior art, typical configurations of conventional memory control systems will be described with reference to FIGS. 1 and 2 that will be later mentioned in "DESCRIPTION OF THE DRAWINGS." The configurations of the conventional memory control systems will be schematically shown in the form of circuit block diagrams.

In a memory control system of the first prior art shown in FIG. 1, an SDRAM control unit (SDRAM controller) 200 is included as a memory control unit for controlling SDRAMs. A plurality of SDRAMs 11 is connected to the SDRAM control unit 200. Data DATA (for example, data DATA [00:31] or data DATA [32:64] of 64 bits long) is input or output to or from the SDRAM control unit 200 and SDRAMs 11 synchronously with a clock CLK. The clock CLK is generated by the SDRAM control unit 200.

In the SDRAM control unit 200, not only the clock CLK but also various control signals and a data mask signal DQM are generated and supplied to the SDRAMs 11 through a signal input/output port 210. Herein, the various control signals are used to control the SDRAMs 11 and the data mask signal DQM is used to mask data DATA. The various control signals include an address signal ADR, a low-address strobe signal /RAS (signal of negative logic), a column address strobe signal /CAS (signal of negative logic), a write enable signal /WE (signal of negative logic), a bank address signal BA, a chip selection signal /CS (signal of negative logic), and a clock enable signal CKE.

In the configuration in which the SDRAMs 11 are connected directly to the SDRAM control unit 200, as mentioned above, the largest load is imposed on an input/output port for outputting various control signals. The maximum driving capacity of the SDRAM control unit 200 is therefore restricted by an input/output port for outputting control signals. The number of SDRAMs that can be connected to the SDRAM control unit is determined by the maximum driving capacity of the SDRAM control unit 200.

Assume, as shown in FIG. 1, that the number of SDRAMs that can be connected to the SDRAM control unit is 4. A semiconductor product having a storage capacity of 64 megabits (M bit) is adopted as SDRAMs which are to be included in a memory control system, whereby a memory space having a data width of 64 bits is realized. In this case, the storage capacity of the memory space is given as follows:

64 megabits×4=256 megabits=32 megabytes (M Byte)

For improving the maximum driving capacity of an SDRAM control unit, a buffer may be inserted to the output stage of an input/output port. Herein, the buffer operates to compensate for the maximum driving capacity.

The circuit block diagram of FIG. 2 shows a memory control system of the second prior art which is conceived of the basis of the above-mentioned technical idea.

In the memory control system of the second prior art shown in FIG. 2, a buffer 300 is interposed between an input/output port 210 of an SDRAM control unit 200 for outputting control signals and SDRAMs 11. The buffer 300 is composed of a plurality of buffer circuits and is used to improve the maximum driving capacity of the SDRAM control unit 200. Thus, the number of SDRAMs that can be connected to the SDRAM control unit can be increased. For example, in the memory control system shown in FIG. 2, since the maximum driving capacity of the SDRAM control unit becomes four times as large as that in the memory control system shown in FIG. 1, the number of SDRAMs that can be connected to the SDRAM control unit can be increased up to 16. Eventually, the storage capacity of an entire memory space also becomes four times (for example, 128 megabytes) as large as that in the memory control system of the first prior art shown in FIG. 1.

However, the fact that the buffer is included in the memory control system shown in FIG. 2 causes a delay in various control signals (an address signal ADR, row address strobe signal /RAS, column address strobe signal /CAS, write enable signal /WE, bank address signal BA, chip selection signal /CS, clock enabling signal CKE, and data mask signal DQM). For controlling especially the SDRAMs that are required to operate at high speed, it becomes difficult to adjust the difference of the timing between different control signals which are output from buffer circuits in the buffer. That is to say, it becomes difficult to adjust a skew occurring between different control signals.

As mentioned above, when a memory control system is realized by employing SDRAMs or the like, the storage capacity of an entire memory space is determined dependent on the type of SDRAMs which are to be employed, and the number of SDRAMs which can be driven by a memory control unit for controlling the SDRAMs. However, the available types of SDRAMs are limited. For realizing a memory space for a large storage capacity by employing SDRAMs, it is therefore necessary to increase the number of SDRAMs which are to be employed.

However, as is apparent from FIG. 1 showing the memory control system of the first prior art, the number of SDRAMs that can be connected to a memory control unit for controlling the SDRAMs is limited. More specifically, the number of SDRAMs depends on a performance of an input/output port of the memory control unit. Further, the number of SDRAMs depends on a capacity of the input/output port concerning a load which can be connected thereto.

By the way, as seen from FIG. 2 showing the memory control system of the second prior art, a technique for increasing the number of SDRAMs that can be driven by a memory control unit is conceivable. Namely, an input/output buffer is connected between the memory control unit and SDRAMs so as to increase the capacity concerning the load which can be connected to the input/output port.

The adoption of the technique implemented in the second prior art requires a design in which a delay of each control signal caused by the connection of the input/output buffer and skews occurring between a plurality of control signals are taken into account. However, SDRAMs connected to the memory control unit are required to operate at higher speed year by year, and therefore it becomes difficult to adjust these skews caused by including a buffer. Therefore, a problem occurs in that even if the number of SDRAMs that can be connected to the memory control unit is increased, access to the SDRAMs cannot be made quickly, and it becomes difficult for the SDRAMs to operate at relatively high speed.

SUMMARY OF THE INVENTION

The present invention attempts to solve the foregoing problems. An object of the present invention is to provide a memory control system and memory control method making it possible to realize a memory space for a large storage capacity by increasing the number of clock synchronous memories which are to be employed, such as SDRAMs, and capable of making access to the SDRAMs quickly so that the SDRAMs can operate quickly.

For solving the problems, a memory control system of the present invention is provided with an interface circuit functioning as an output buffer synchronous with a clock. Furthermore, the interface circuit holds a memory control signal, which is output from a memory control unit for controlling at least one clock synchronous memory that is supposed to be controlled by the memory control unit. The interface circuit then transmits the memory control signal to the memory in a predetermined time. Access to the memory is made in consideration of the delay time required for the memory control signal to reach the memory via the interface circuit.

Preferably, a memory control system of the present invention is provided with a facility capable of determining the presence or absence of the interface circuit for holding a memory control signal according to an operation mode in which the memory control unit is established. The time required from a transmission of the memory control signal until a transmission or reception of data can be selectively defined as only a latency required by the memory or defined as a sum of the delay time caused by the interface circuit and the latency required by the memory.

By the way, according to a memory control method of the present invention, a memory control signal which is output from a memory control unit in order to control at least one clock synchronous memory, is held in an interface circuit that operates synchronously with a clock. When a predetermined time has elapsed, the memory control signal is transmitted to the memory. Access to the memory is then made in consideration of the delay time required for the memory control signal to reach the memory.

Preferably, according to a memory control method of the present invention, the presence or absence of the interface circuit for holding the memory control signal is determined based on an operation mode in which the memory control unit is established. The time required from a transmission of a memory control signal until a transmission or reception of data can be selectively defined as a latency required by the memory or defined as a sum of the delay time caused by the interface circuit and the latency required by the memory.

Now, the term "latency" means a time interval from the instant in which an MPU in the memory control unit issues a request for data (for example, the instant in which the MPU outputs a column address strobe signal), until the instant in which reading data from the memory or writing data to the memory is actually started. The latency may be referred to as a "waiting time."

According to the memory control system and memory control method of the present invention, the interface circuit that operates synchronously with a clock is interposed between the memory control unit and clock synchronous memories. A memory space of a large storage capacity can therefore be realized by increasing the number of clock synchronous memories that can be connected to the memory control unit. Moreover, access to these memories can be made quickly, and the memories operate at relatively high speed.

BRIEF DESCRIPTION OF THE DRAWINGS

The above object and features of the present invention will be more apparent from the following description of the preferred embodiments with reference to the accompanying drawings, wherein:

FIG. 9 is a timing chart for explaining a read operation which is to be performed by some embodiments of a memory control system of the present invention; and FIG. 10 is a timing chart for explaining a write operation which is to be performed by some embodiments of a memory control system of the present invention.

DESCRIPTION OF THE PREFERRED EMBODIMENTS

Referring to FIGS. 3 to 10, a basic embodiment and preferred embodiments of the present invention will be described below.

Figure 3:
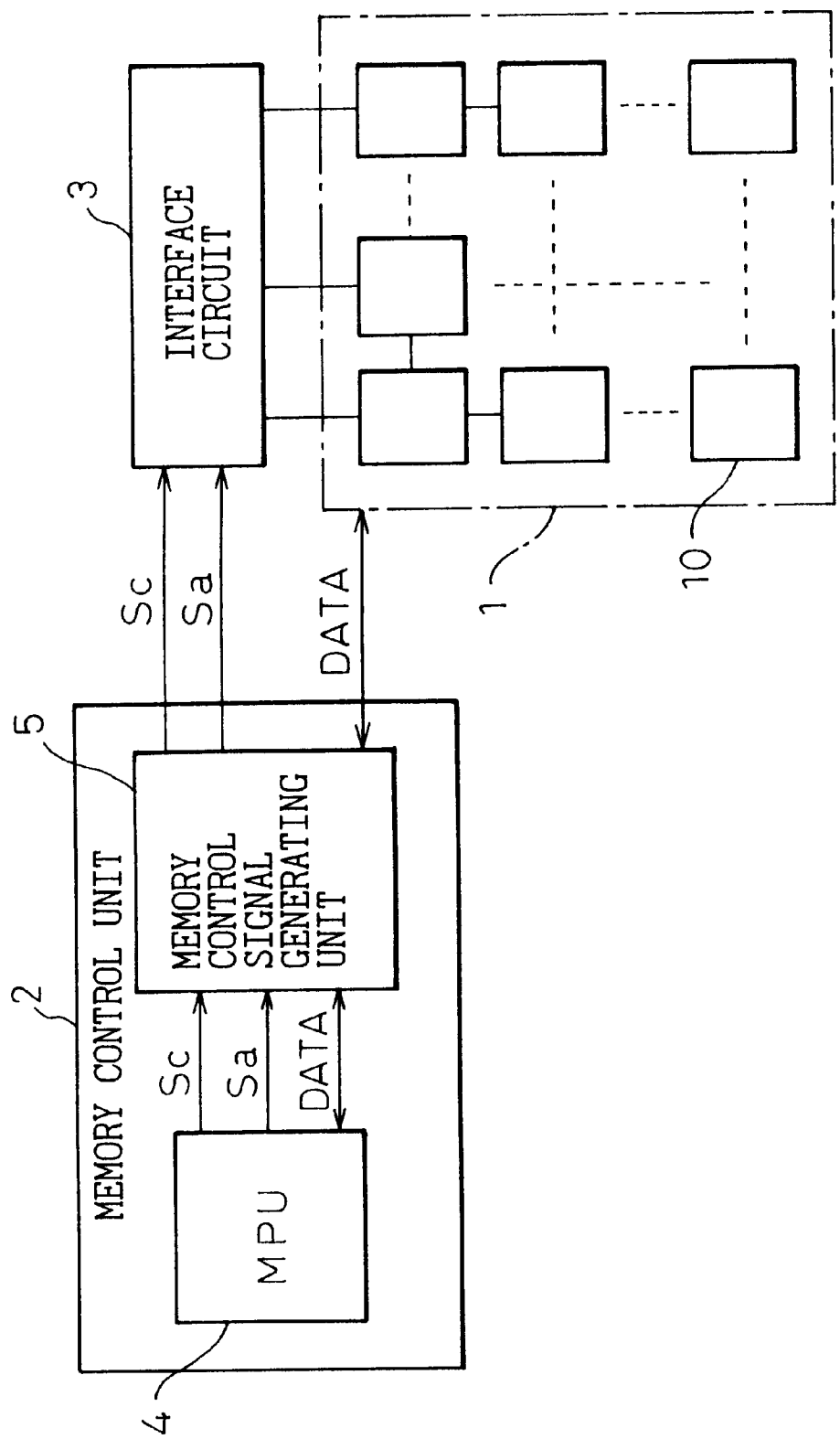
FIG. 3 is a block diagram showing a configuration of a basic embodiment based on the principle of the present invention.

FIG. 3 is a block diagram showing a configuration of a basic embodiment based on the principle of the present invention, wherein a configuration of a memory control system is shown schematically.

Figure 1:
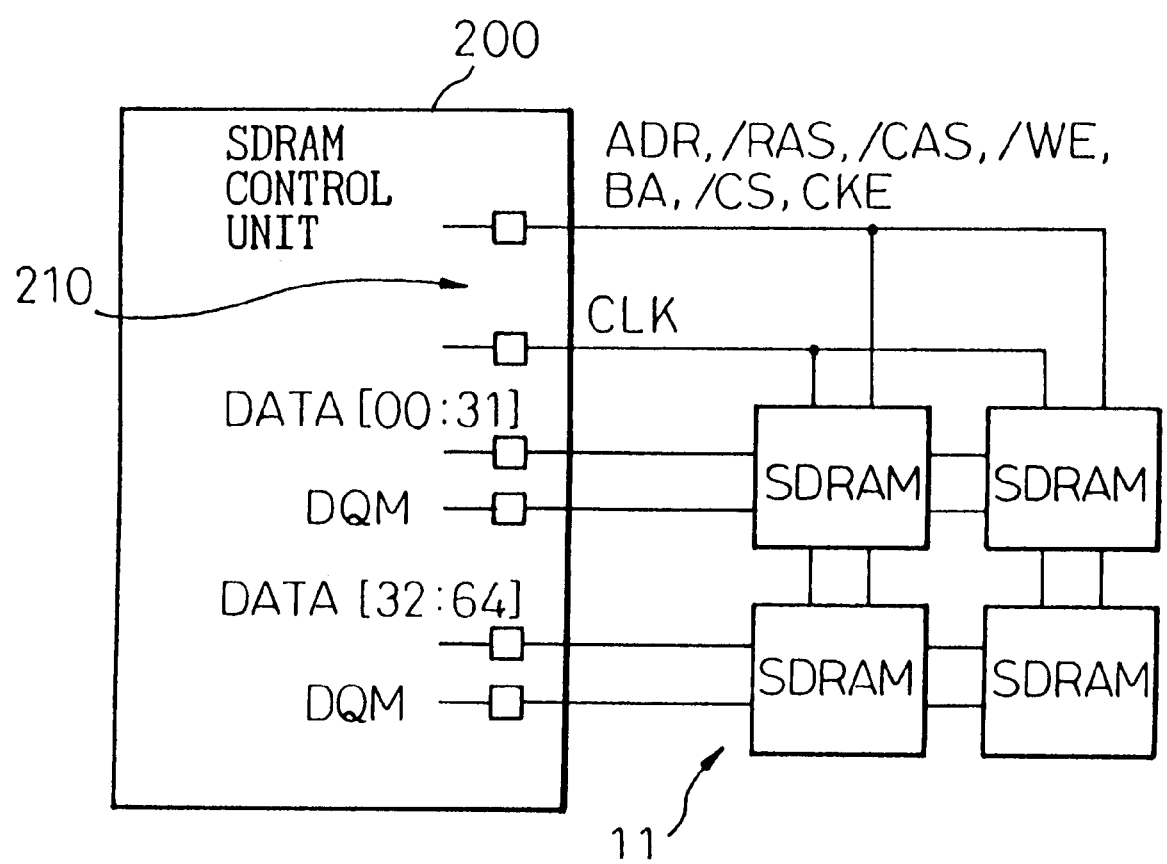
FIG. 1 is a circuit block diagram showing a memory control system of the first prior art.
Figure 2:
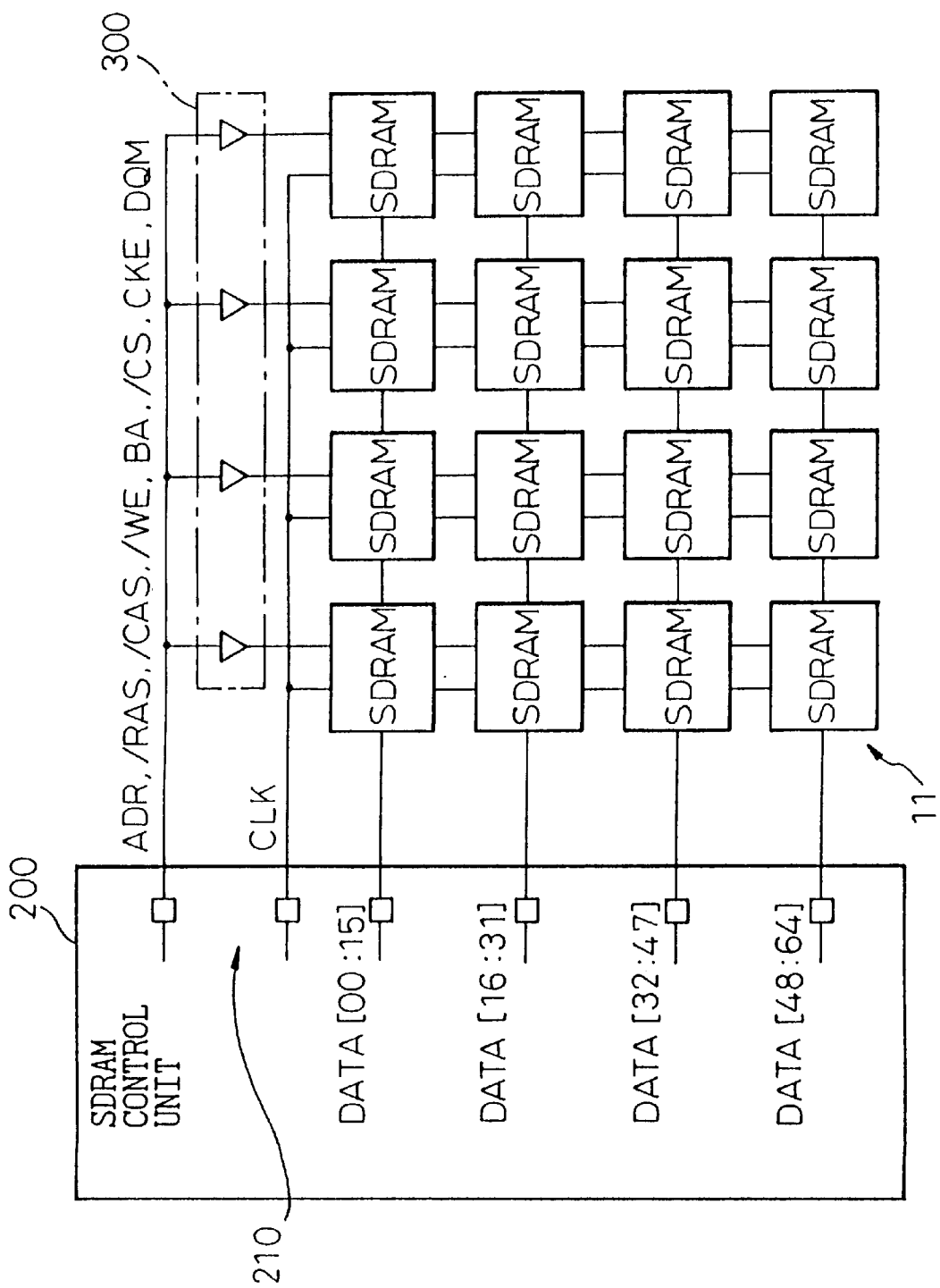
FIG. 2 is a circuit block diagram showing a memory control system of the second prior art.

FIG. 3 shows a memory control unit 2 having almost the same capability as the conventional SDRAM control units 200 (See FIGS. 1 and 2). A plurality of clock synchronous memories 10 constituting a memory unit 1 are connected to the memory control unit 2. The memory control unit 2 includes an MPU 4 and a memory control signal generating unit 5. Specifically, the MPU 4 controls the memory unit 1 composed of the plurality of memories 10. The memory control signal generating unit 5 generates and outputs various control signals Sc, an address signal Sa, and data DATA in response to a command sent from the MPU 4. Herein, the control signals Sc used to control the memories, and the address signal Sa which is to be transmitted over an address bus are collectively referred to as memory control signals. The data DATA is transmitted over a data bus.

For solving the aforesaid problems, the memory control system in accordance with the basic embodiment of the present invention shown in FIG. 3 includes an interface circuit 3 that functions as an output buffer synchronous with a clock. The interface circuit 3 holds a memory control signal which is output from the memory control unit 2 for controlling a memory, and transmits the memory control signal to the memory 10 in a predetermined time. In the thus configured memory control system, access to each memory 10 is made in consideration of the delay time required for a memory control signal to reach the memory 10 via the interface circuit 3.

Preferably, the memory control system in accordance with the basic embodiment of the present invention has a facility capable of determining the presence or absence of the interface circuit 3 for holding a memory control signal Sc. Herein, the facility determines the presence or absence based on an operation mode in which the memory control unit 2 is established. The time required from a transmission of the memory control signal until a transmission or reception of data can be selectively defined as a latency required by each memory 10 or defined as a sum of the delay time caused by the interface circuit 3 and the latency required by the memory 10.

As described in "SUMMARY OF THE INVENTION," the term "latency" means a time interval from the instant in which the MPU 4 in the memory control unit 2 issues a request for data, until the instant in which reading data or writing data from or to a memory 10 is actually started.

On the other hand, according to a memory control method of the basic embodiment of the present invention, clock synchronous memories are controlled by operating a memory control system or the like. A memory control signal which is output from the memory control unit for controlling a memory, is held in an interface circuit. In a predetermined time, the memory control signal is transmitted to the memory. The memory is accessed in consideration of the delay time required for the memory control signal to reach the memory.

Preferably, in the memory control method, the presence or absence of the interface circuit for holding a memory control signal is determined based on an operation mode in which the memory control unit is established. The time required from a transmission of the memory control signal until a transmission or reception of data can be selectively defined as a latency required by each memory or defined as a sum of the delay time caused by the interface circuit and the latency required by the memory.

To be more specific, in the memory control system shown in FIG. 3, the interface circuit 3 such as an interface unit is substituted for a mere buffer (See FIG. 2). Herein, the interface circuit 3 operates with the same frequency as a frequency corresponding to a clock supplied to a memory 10. The interface circuit 3 is interposed between the memories 10 such as SDRAMs and the memory control unit 2 for controlling the memories 10. Preferably, the interface circuit 3 is composed of a plurality of output buffers.

Furthermore, in the memory control system shown in FIG. 3, a memory control signal containing a control signal Sc and address signal Sa which are output from the memory control unit 2 is held in the interface circuit 3. The thus held memory control signal is transmitted from the interface circuit 3 to a memory 10 in a predetermined cycle (for example, a cycle corresponding to one clock).

The memories 10 having the number that is as large as a value corresponding to the driving capacity of the interface circuit 3, such as an interface unit, can be connected to the interface circuit 3. In response to a memory control signal which is output from the interface circuit 3, a memory 10 such as an SDRAM starts transmitting or receiving data with a predetermined latency.

Assume that the driving capacity of each output buffer included in the memory control unit 2 for transmitting a memory control signal is indicated with 4. If the capacity of each memory, such as an SDRAM, concerning a load is indicated with 1, the number of memories 10 that can be connected directly to the memory control unit 2 is 4 (See FIG. 2).

Furthermore, if the capacity of an interface circuit of the present invention concerning an input load is indicated with 1, the number of output buffers that can be connected to the memory control unit 2 is 4. Herein, the interface circuit 3 composed of four output buffers is interposed between the memory control unit 2 and memories 10.

Assuming that the maximum driving capacity of the interface circuit 3 is indicated with 4, the number of memories 10 that can be connected to one output buffer is 4. A total number of memories that can be driven by the memory control unit 2 is 16 (4×4=16). Thus, a storage capacity that is four times as large as that in the first prior art described before can be realized.

The interface circuit 3 operates synchronously with a clock supplied to a memory 10 such as an SDRAM. A skew occurring between different memory control signals can therefore be adjusted easily. The memory control unit transmits or receives memory control signals and data. Herein, the operations of transmitting or receiving data are carried out in consideration of a latency and a delay of each memory control signal caused by a register or the like.

According to the memory control system and memory control method of the basic embodiment of the present invention, the interface circuit that operates synchronously with a clock is interposed between the memory control unit and clock synchronous memories. Consequently, a memory space for a large storage capacity can be realized by increasing the number of clock synchronous memories that can be connected to the memory control unit. Besides, the memories can be accessed quickly and operate duly.

For better understanding of the constituent features of preferred embodiments of the present invention, a configuration of an SDRAM employed in the embodiments and the operations of the SDRAM will be described. The preferred embodiments will be described later in conjunction with FIGS. 6 to 10.

Figure 4:
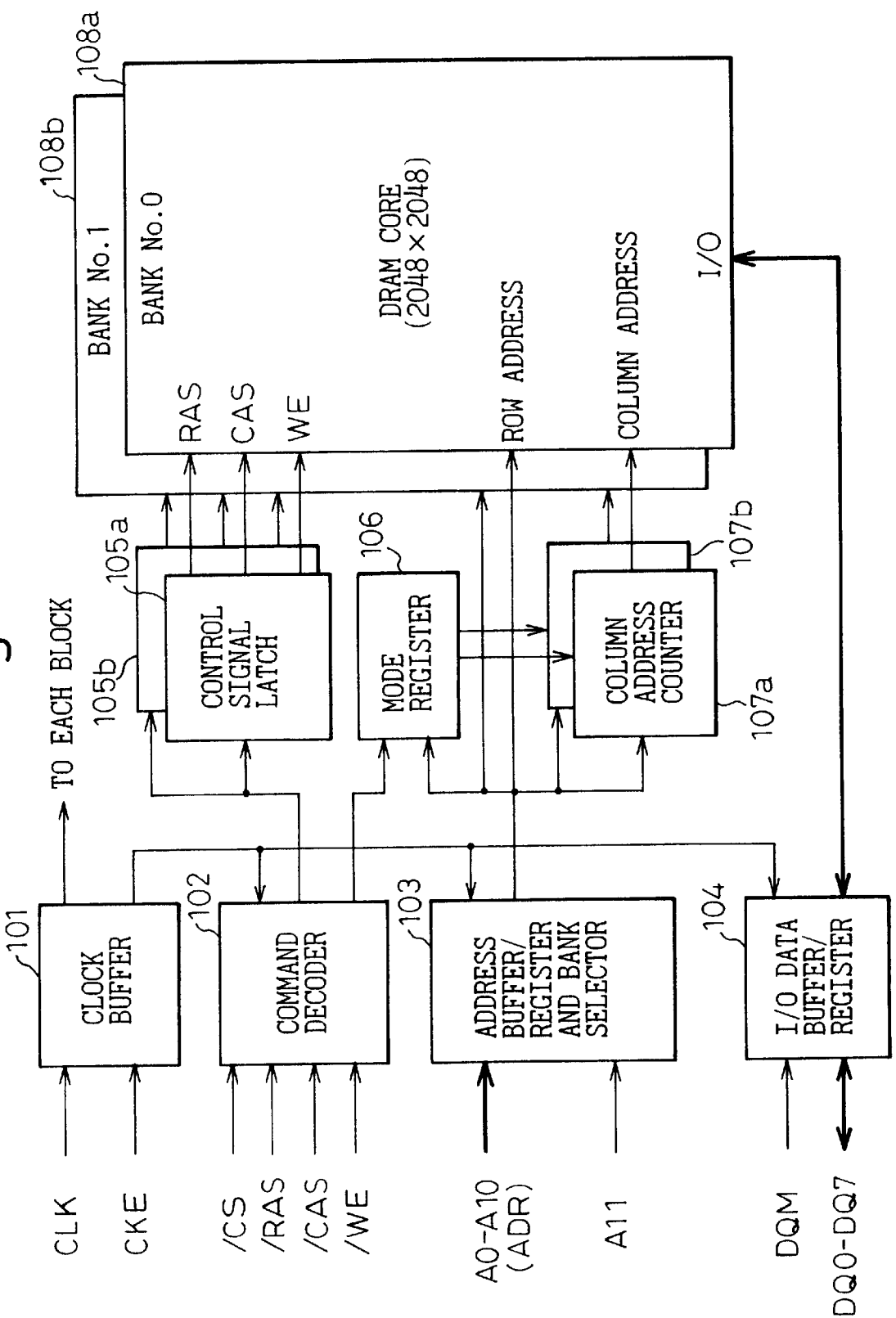
FIG. 4 is a block diagram showing an outline configuration of a synchronous DRAM employed in a memory control system of the present invention.
Figure 5:
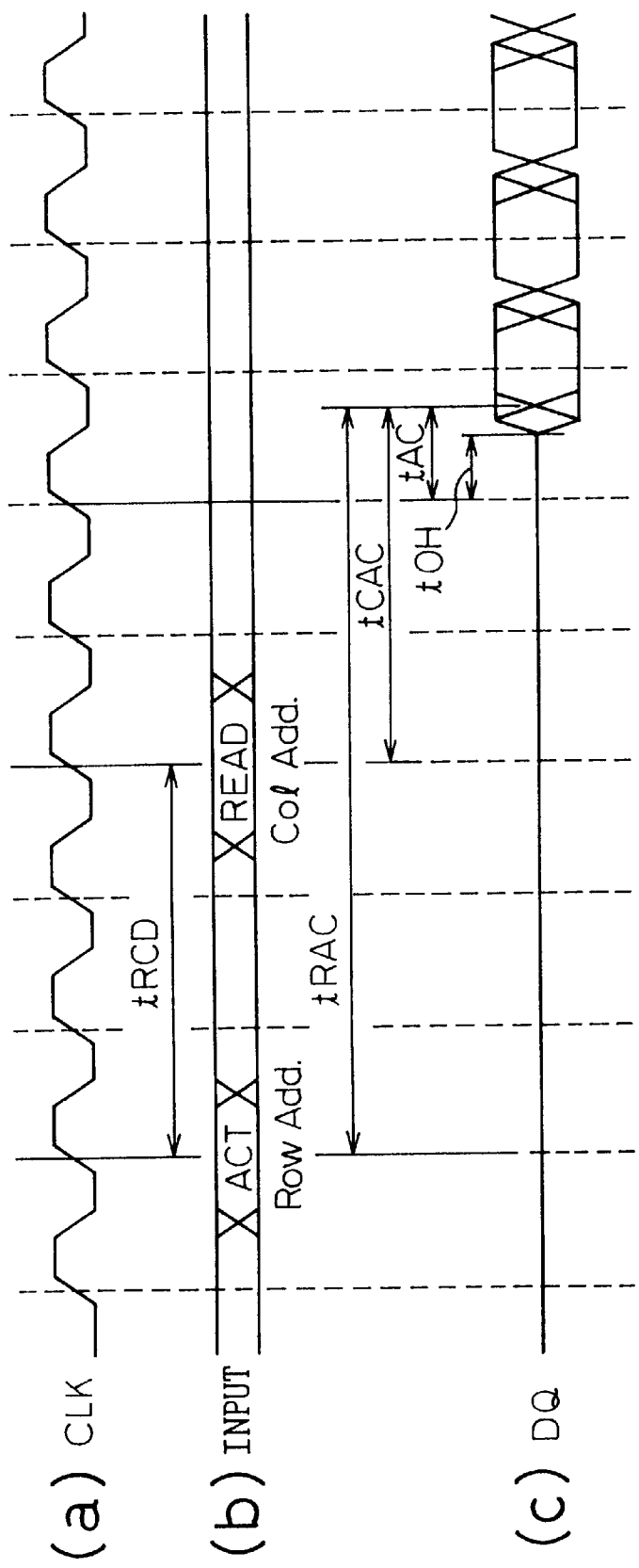
FIG. 5 is a timing chart for explaining the operations of the synchronous DRAM shown in FIG. 4.

FIG. 4 is a block diagram showing an outline configuration of an SDRAM employed in a memory control system of the present invention. FIG. 5 is a timing chart for explaining the operations of the SDRAM shown in FIG. 4.

A semiconductor chip having an SDRAM shown in FIG. 4 consists of DRAM cores 108a and 108b, control signal latches 105a and 105b, a mode register 106, and column address counters 107a and 107b. Specifically, the DRAM cores 108a and 108b each have a storage capacity of 2048 bits×2048 bits and are formed with a plurality of banks (for example, banks Nos. 0 and 1) that provide memory areas in the chip. The control signal latches 105a and 105b each hold various chip control signals to be supplied to the DRAM cores 108a and 108b (a row address control signal RAS, column address control signal CAS, and write enable signal WE). The column address counters 107a and 107b each count pulses to indicate a column address and thus enable access to data.

Furthermore, the semiconductor chip shown in FIG. 4 includes a clock buffer 101, a command decoder 102, an address buffer/register and bank selector 103, and an I/O data buffer/register 104. Specifically, the clock buffer 101 holds a clock CLK (that is, an external clock) serving as a reference for operating the SDRAM in response to a clock enable signal CKE. The clock buffer 101 then supplies the clock CLK to another input circuit portion or a plurality of blocks in the semiconductor chip. The command decoder 102 decodes various control signals, that is, command signals (a chip selection signal /CS, row address strobe signal /RAS, column address strobe signal /CAS, and write enable signal /WE). The command decoder 102 then supplies resultant signals to the control signal latches 105a and 105b and the mode register 106. The address buffer/register and bank selector 103 holds memory address signals A0 to A10 including a row address signal and column address signal, and a bank address signal A11. The address buffer/register and bank selector 103 supplies the signals to the mode register 106, column address counters 107a and 107b, and DRAM cores 108a and 108b. The I/O data buffer/register 104 holds various data items DQ (DQ0 to DQ7) together with a data mask signal DQM, and supplies them to the I/O ports of the DRAM cores. All control circuits except the DRAM cores 108a and 108b are preferably incorporated in the memory control unit 2 shown in FIG. 3.

In FIG. 4, the command signals including the chip selection signal /CS, row address strobe signal /RAS, column address strobe signal /CAS, and write enable signal /WE provide various commands depending on which of them are combined with each other. With a command, an operation mode is determined. The various commands are interpreted by the command decoder 102. The circuits are then controlled according to the operation mode determined with the command. On the other hand, the chip selection signal /CS, row address strobe signal /RAS, column address strobe signal /CAS, and write enable signal /WE are also input to the control signal latches 105a and 105b. A state that is represented by the current command signal is maintained until a subsequent command is input.

Furthermore, in FIG. 4, the memory address signals A0 to A10 and bank address signal A11 (A0 to A11 correspond to the address signal ADR in FIGS. 1 and 2) are amplified by the address buffer/register and bank selector 103. The resultant signals indicate a row address in each bank, and provide an initial value for the column address counter 107a or 107b. A signal read from the DRAM core 108a or 108b is amplified by the I/O data buffer/register 104, and output synchronously with the leading edge of the external clock CLK that is input externally. With regard to an input of data, similar operations are performed. Eventually, data that is input to the I/O data buffer/register 104 is written in the DRAM core 108a or 108b.

Referring to the timing chart shown in FIG. 5, various control signals (shown in portion (b)) are input to a DRAM core synchronously with the leading edge of the external clock CLK shown in portion (a). Data is then read from the DRAM core. First of all, a row address in a memory matrix in the DRAM core is identified. A column address is identified in a given delay time (corresponding to a row address access time tRCD to be described later). A data read operation is then started.

To be more specific, for reading data from the SDRAM, an activation (ACT) command indicated with a combination of any of the various command signals is input through a command terminal. A row address signal is input through an address terminal. When such a command and row address are input, the SDRAM becomes active. A word line specified with the row address is selected, and cell information on the selected word line is placed on bit lines. Thereafter, signals representing the cell information are amplified by sense amplifiers. In the time required for the circuits involved in accessing the row address to operate (row address access time tRCD), a read command (READ) and column address are input. A sense amplifier is selected according to the column address, and data is output from the sense amplifier over the data bus. Thereafter, a signal representing the data is amplified by a data bus amplifier, and further amplified by a data output buffer. Consequently, data DQ (portion (c)) is output through an output terminal.

The foregoing series of operations are identical to that of a general-purpose DRAM. In the case of the SDRAM, however, the circuits involved in handling a column address are constructed to carry out pipeline operations. Data that has been read out is output continuously cyclically. A cycle of data transfer is therefore equal to the cycle corresponding to the clock CLK.

The time required to make access to the SDRAM contains three types of access time. These types of access time is defined with the leading edge of the clock CLK as a reference. In FIG. 5, a row address access time tRAC is the time required for the circuits involved in treating a row address to operate. A column address access time tCAC is the time required for the circuit involved in treating a column address to operate. A clock access time tAC is a time lag from an input of the clock CLK until an output of data. When the SDRAM is employed in a high-speed memory system, both the time tRAC and time tCAS each representing the time required for obtaining data first, from the instant in which a command is input, are important. However, for improving a data transfer rate, the clock access time tAC is also important.

Referring to FIG. 5, an output data hold time tOH is the time succeeding the previous data transfer cycle or preceding the next data transfer cycle. Since the characteristics of an SDRAM differ from one SDRAM to another and depends on a temperature and supply voltage, the time tAC and time tOH do not agree with each other but have a certain time difference between them. During a time period corresponding to the time difference, data which is to be output through the output terminal is uncertain. When data is thus uncertain, that is, during data uncertainty time, it is unknown what kind of data is output. During the data uncertainty time, the memory control system cannot be used.

The data uncertainty time tends to vary with a respect to an uncertainty in characteristics of an SDRAM, a change in temperature, or a fluctuation in supply voltage. Nevertheless, for outputting data without an error according to the correct timing, data must be output at a given phase relative to the clock CLK. In other words, the clock access time tAC is required to remain constant all the time. For example, when data should preferably be output synchronously with the leading edge of an internal clock, a phase difference between the clock CLK and internal clock must always be retained at a given angle, for example, 360° (0°). For this purpose, a delay occurring in a variable delay circuit in a DLL (abbreviation for a delay locked loop) circuit incorporated in an SDRAM must be set properly.

Figure 6:
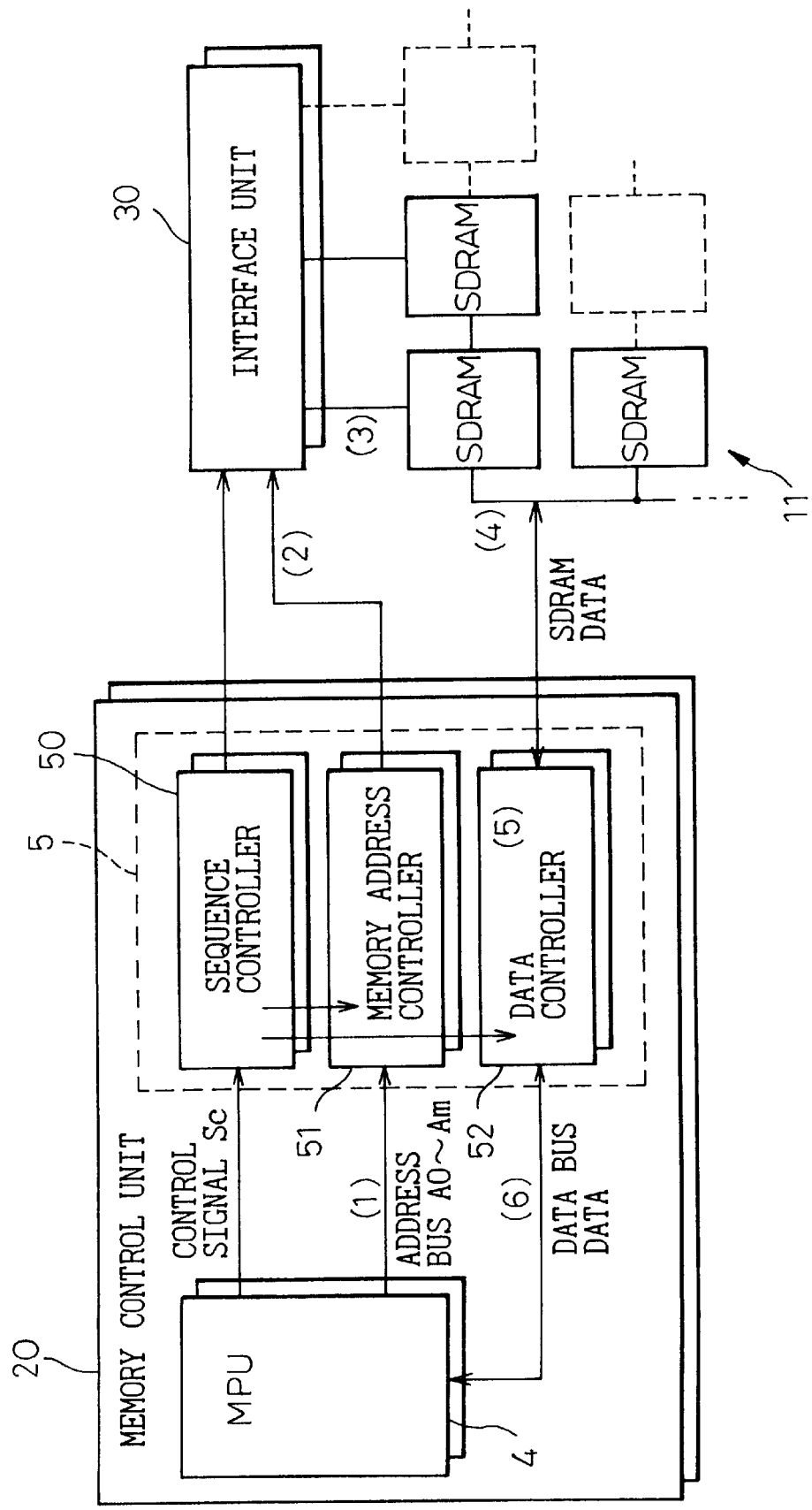
FIG. 6 is a circuit block diagram showing a first preferred embodiment of the present invention.

FIG. 6 is a block diagram showing a configuration of a first preferred embodiment of the present invention. In subsequent drawings, the same reference numerals will be assigned to components identical to those mentioned above.

In the first preferred embodiment shown in FIG. 6, a memory control unit 20 is incorporated as the aforesaid memory control unit 2. The memory control unit 20 transmits or receives control signals Sc used to read or write a plurality of SDRAMs 11, address signals A0 to Am (where m is any positive integer), and data DATA. The address signals A0 to Am substantially correspond to the address signal Sa in FIG. 3.

To be more specific, the memory control unit 20 shown in FIG. 6 includes an MPU 4, a sequence controller 50, a memory address controller 51, and a data controller 52. Herein, the MPU 4 controls a memory unit composed of a plurality of SDRAMs 11 for storing data. The sequence controller 50 transmits the control signals Sc, address signals A0 to Am, and data DATA to an SDRAM 11 in response to an instruction issued from the MPU 4. Preferably, the three control blocks of the sequence controller 50, memory address controller 51, and data controller 52 are incorporated in the aforesaid memory signal generating unit (FIG. 3).

Furthermore, in the first preferred embodiment shown in FIG. 6, an interface unit 30 is interposed between the sequence controller 50 and memory address controller 51 in the memory control unit 20 and the SDRAMs 11. The interface unit 30 has, similar to the aforesaid interface circuit 3, the capability of an output buffer that operates synchronously with a clock CLK. The interface unit 30 holds a control signal Sc and address signals A0 to Am (that is, a memory control signal), which are output from the memory control unit 20 for controlling an SDRAM 11. In a certain time, the interface unit 30 transmits the memory control signal to the SDRAM 11. In short, the interface unit 30 operates synchronously with a clock supplied to the SDRAM 11. The interface unit 30 has the ability to hold any memory control signal (any control signal Sc and the address signals A0 to Am) used to control the SDRAM 11 during the cycle of the clock.

Next, the operations of the memory control unit 20 shown in FIG. 6 will be described briefly. When a request for access to an SDRAM 11 is issued from the MPU 4 in the memory control unit 20, the memory address controller 51 decodes the address signals A0 to Am sent over the address bus. The memory address controller 51 then produces a row address and column address ((1) in FIG. 6). The sequence controller 50 instructs the timing of outputting the row address and column address produced by the memory address controller 51. The row address and column address are then output to the interface unit 30, and a control signal Sc used to control the SDRAM is output ((2) in FIG. 6).

The interface unit 30 receives the control signal Sc used to control the SDRAM. As shown in the timing chart of FIG. 7, the interface unit 30 then transmits the control signal sent from the memory control unit 20 to the SDRAM 11 in one cycle corresponding to the clock ((3) in FIG. 6).

The SDRAM 11 receives the control signal from the interface unit 30. When the latency inherent to the SDRAM has elapsed, the SDRAM 11 transmits SDRAM data or data stored therein to the memory control unit 20 ((4) in FIG. 6).

In response to an instruction sent from the sequence controller 50, the data controller 52 in the memory control unit 20 fetches data. The timing of fetching data comes in one cycle corresponding to the clock after passage of the latency inherent to the SDRAM ((5) in FIG. 6).

Furthermore, the data controller 52 transmits data received from the SDRAM 11 (herein DATA) to the MPU 4 over the data bus ((6) in FIG. 6).

In the foregoing first preferred embodiment, the interface unit 30 is operated at the rate equivalent to the frequency of the clock which is to be supplied to an SDRAM 11. The skews occurring between various memory control signals can be adjusted easily. The memory control unit 20 for transmitting or receiving the memory control signals and data makes access to an SDRAM 11. For this access, the memory control unit 20 takes account of the delay time required for a memory control signal to reach the SDRAM 11, and a latency inherent to the SDRAM. Besides, the delay time required for the memory control signal to pass through the interface unit 30 is also taken into consideration. The delay of a memory control signal is thus caused by the interface unit 30 interposed between the memory control unit 20 and SDRAMs 11. However, the delay is compensated for by transmitting the memory control signal earlier by one cycle corresponding to the clock from the memory control unit that transmits or receives data to or from the SDRAMs.

Preferably, a memory control method of the present invention is implemented in the memory control system in accordance with the first preferred embodiment. In the memory control method, a memory control signal which is output from a memory control unit in order to control a clock synchronous SDRAM, is held in an interface unit.

When a predetermined time has elapsed, the memory control signal is transmitted to the SDRAM. Access to the SDRAM is made in consideration of the delay time required for the memory control signal to reach the SDRAM (including the delay time therefor to pass through a register or flip-flop in the interface unit).

Figure 7:
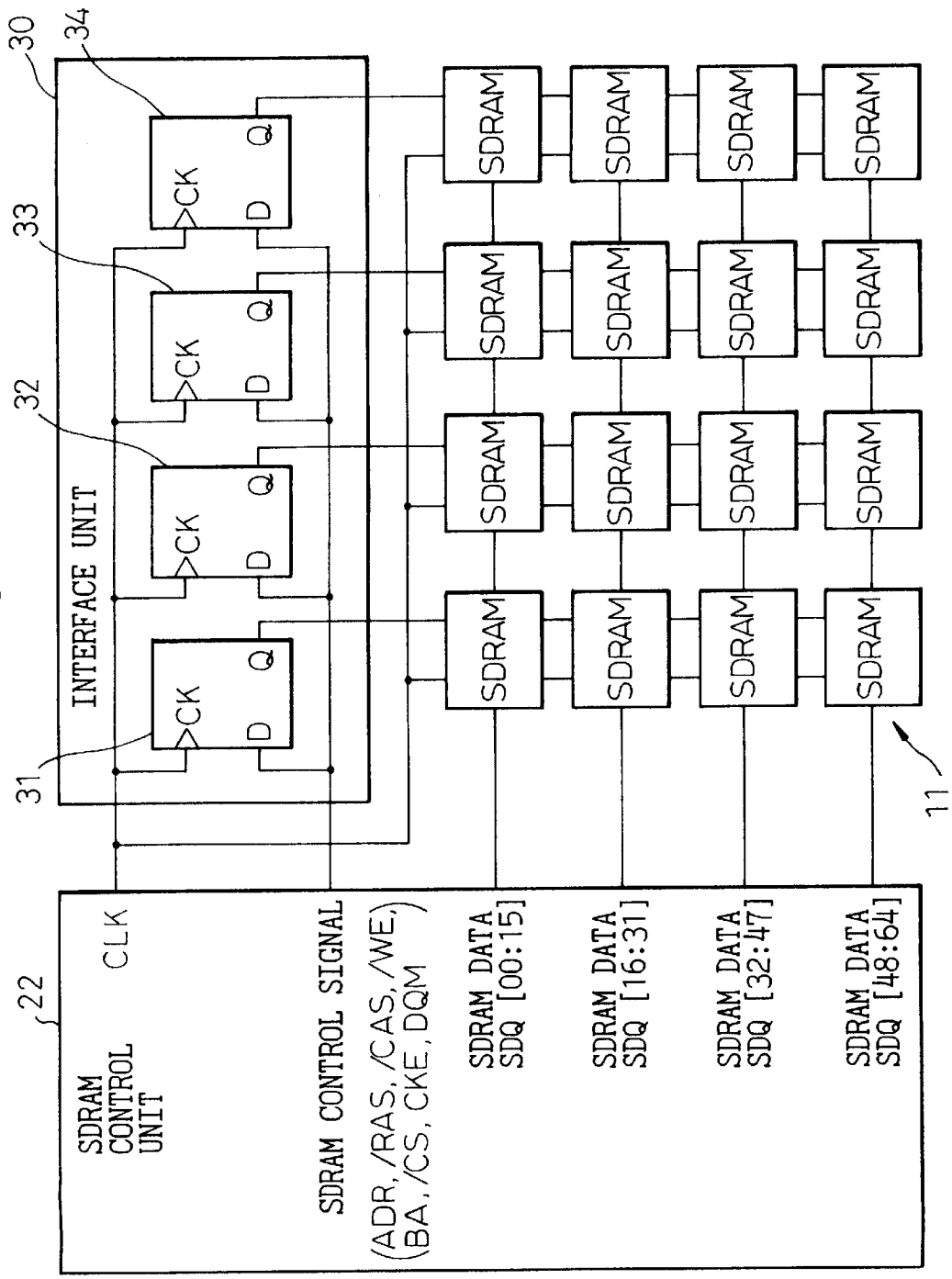
FIG. 7 is a circuit block diagram showing a practical configuration of the interface unit shown in FIG. 6.

FIG. 7 is a circuit block diagram showing a practical configuration of the interface unit shown in FIG. 6. Herein, a plurality of flip-flops that are first to fourth flip-flops (FF) 31 to 34 is used as the interface unit 30.

In FIG. 7, an SDRAM control unit (SDRAM controller) 22 is shown as a memory control unit for controlling SDRAMs. A plurality of SDRAMs 11 are connected to the SDRAM control unit 22. SDRAM data (for example, SDRAM data SDQ[00:15], SDQ[16:31], SDQ[32:47], or SDQ[48:64] having a length of 64 bits) is input or output to or from the SDRAM control unit 22 and an SDRAM 11 synchronously with a clock CLK produced by the SDRAM control unit 22.

Furthermore, in the SDRAM control unit 22 shown in FIG. 7, not only the clock CLK but also various SDRAM control signals used to control the SDRAMs 11 are produced and sent to the interface unit 30. An address signal ADR, a row address strobe signal /RAS, a column address strobe signal /CAS, a write enable signal /WE, a bank address signal BA, a chip selection signal /CS, a clock enable signal CKE, and a data mask signal DQM are produced as the various SDRAM control signals.

Now, one of the various SDRAM control signals, for example, the column address strobe signal /CAS will be discussed. The column address strobe signal /CAS is output from the SDRAM control unit 22, and input to the interface unit 30 composed of the first to fourth flip-flops 31 to 34. In the interface unit 30, the column address strobe signal /CAS is applied to D input terminals of the first to fourth flip-flops 31 to 34 that are four D flip-flops. The column address strobe signal /CAS is held synchronously with a clock CLK input through any of clock input terminals CK of the D flip-flops. Furthermore, the column address strobe signal /CAS is output as a Q output through any of Q output terminals of the D flip-flops in one cycle of the clock. In the interface unit comprising these circuit elements, all the SDRAM control signals output from the SDRAM control unit 22 are treated in the same manner as the column address strobe signal /CAS.

The interface unit 30 in FIG. 7 is composed of a plurality of flip-flops such as D flip-flops. Alternatively, the interface unit 30 may be composed of a plurality of registers. Even in this case, similar to when the interface unit 30 is composed of a plurality of flip-flops, an SDRAM control signal is temporarily held and then sent in the cycle corresponding to one clock.

The SDRAMs having the number that is as large as a value within the range which does not exceed the maximum driving capacity of the SDRAM control unit 22, can be connected to the flip-flops or registers constituting the interface unit 30. In FIG. 7, the maximum driving capacity of the SDRAM control unit 20 is indicated with 4, and the capacity of a register concerning an input load is indicated with 1. Assuming that the maximum driving capacity of the interface circuit 3 is indicated with 4, the number of SDRAMs that can be connected to one output buffer is 4. A total number of memories that can be driven by the memory control unit 2 is 16 (4×4=16). Thus, approximately four times as large a storage capacity as that permitted by the first prior art can be realized.

An SDRAM control signal held in a flip-flop or the like during the N-th cycle of the clock CLK is output from the flip-flop or the like during, for example, the (N+1)-th cycle thereof. Assuming that the maximum driving capacity of a flip-flop is indicated with 4 and the capacity of an SDRAM concerning a load is indicated with 1, the number of SDRAMs that can be connected to the flip-flop is 4. Finally, a total number of SDRAMs that can be connected to the SDRAM control unit 22 is 16.

For example, a product having a storage capacity of 64 megabits is adopted for SDRAMs in a memory control system. When a memory space permitting a data width of 64 bits is realized, the storage capacity of the whole memory space is given as follows:

64 megabits×16=1024 megabits=128 megabytes

According to the above estimation, the configuration of the first embodiment of the present invention can offer a storage capacity four times as large as that offered by the configuration of the prior art (as mentioned above, 32 megabytes is offered by the configuration shown in FIG. 1). However, the storage capacity depends on the relationship between the driving capacity of the interface unit and an input load.

Figure 8A:
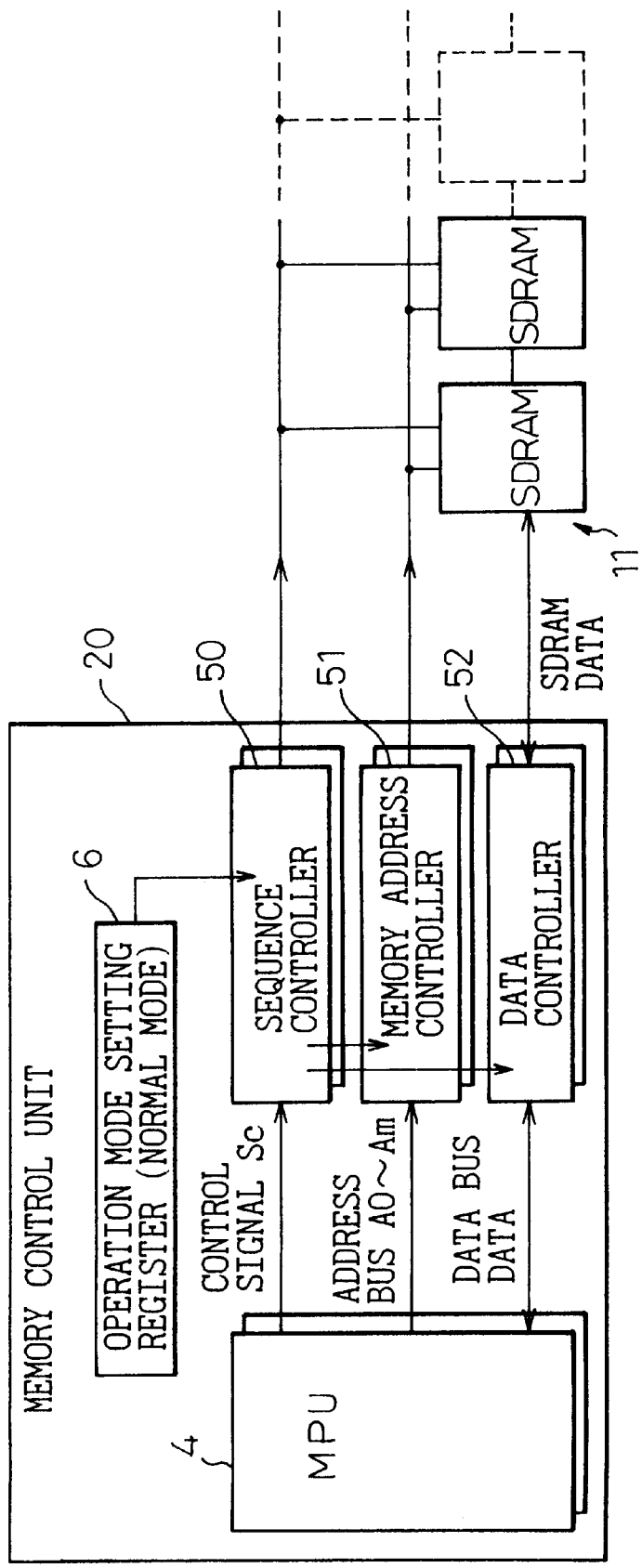
FIGS. 8A and 8B are circuit block diagrams showing a configuration of a second preferred embodiment of the present invention.
Figure 8B:
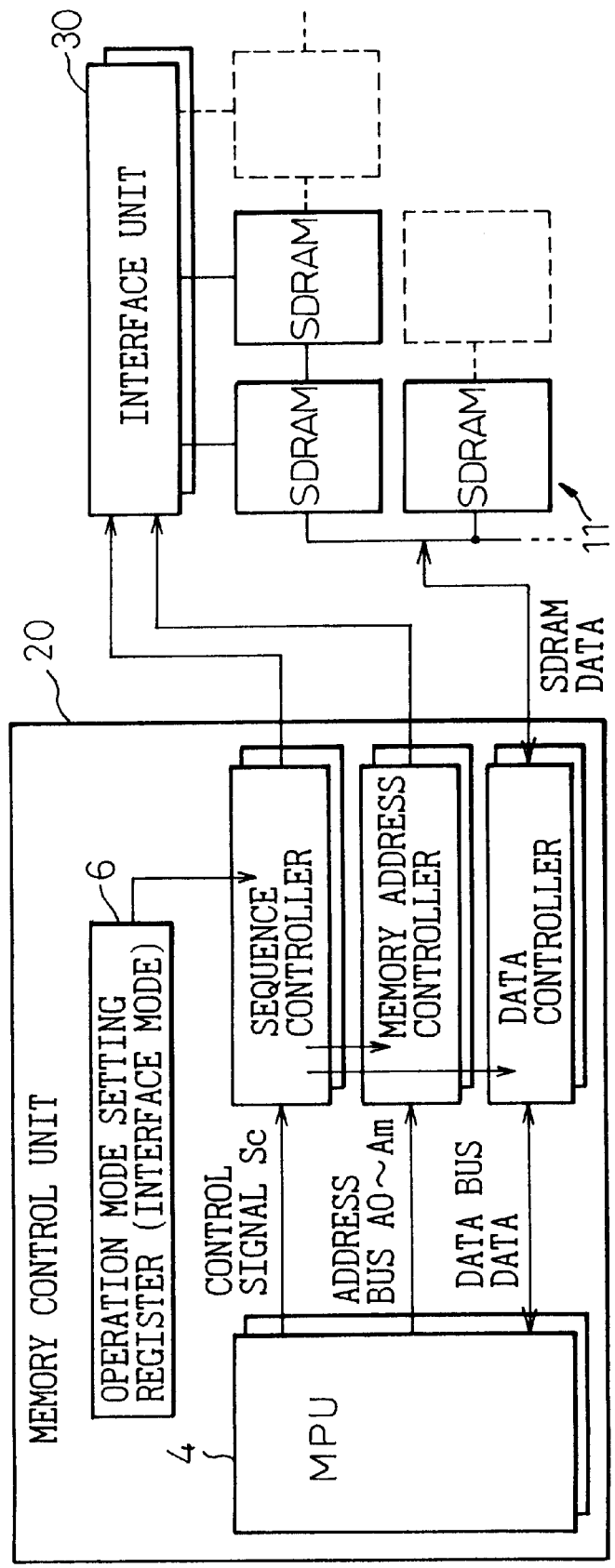

FIGS. 8A and 8B are circuit block diagrams showing a configuration of a second preferred embodiment of the present invention. Herein, an operation mode setting register 6 for designating either one of a normal mode (See FIG. 8A) and interface mode (See FIG. 8B) is incorporated in the memory control unit 20. This is the only difference from the first preferred embodiment (FIG. 6).

The components of the memory control unit 20 other than the operation mode setting register 6 (FIGS. 8A and 8B) and the components of the interface unit 30 are identical to those of the first preferred embodiment (FIG. 6). The description of the other components will be omitted.

The contents of the operation mode setting register 6 shown in FIGS. 8A and 8B are transmitted to the sequence controller 50. Operations described below are then carried out.

As shown in FIG. 8A, when a memory control system need not employ a large-capacity structure composed of SDRAMs, the operation mode setting register 6 is set to a "normal mode." This is intended to indicate absence of the interface unit 30. In the normal mode, the timing of inputting or outputting data is determined in consideration of a latency required by an SDRAM 11. In this case, therefore, the time required from a transmission of an SDRAM control signal such as a column address strobe signal /CAS until a transfer of data is defined as the latency required by the SDRAM 11.

As shown in FIG. 8B, when a memory control system requires a large storage capacity structure composed of SDRAMs, the operation mode setting register 6 is set to an "interface mode." This is intended to indicate the presence of the interface unit 30. When the interface unit 30 is, as shown in FIG. 7, composed of flip-flops, data is input or output according to the timing that comes in one cycle corresponding to a clock after passage of the latency required by an SDRAM. In this case, the time required from a transmission of a memory control signal such as the column address strobe signal /CAS until a transfer of data is defined as a sum of the delay time caused by the interface unit and the latency required by the SDRAM.

In the second preferred embodiment shown in FIG. 8, operation modes are switched by means of the operation mode setting register. Alternatively, external pins may be used to designate an operation mode.

Preferably, the memory control method of the present invention is implemented in the memory control system in accordance with the second preferred embodiment. In the memory control method, the presence or absence of the interface unit for holding a memory control signal is determined based on an operation mode in which the memory control unit is established. The time required from a transmission of a memory control signal until a transfer of data is selectively defined as a latency required by an SDRAM or defined as a sum of the latency required by the SDRAM and a delay time caused by the interface unit.

FIG. 9 is a timing chart for explaining a read operation performed in some embodiments of a memory control system in accordance with the present invention. When the aforesaid interface unit (FIG. 6) is employed, it takes one cycle corresponding to a clock until one certain memory control signal reaches a memory such as an SDRAM after the memory control unit output a command. The relationship between the memory control signal that is output from the memory control unit and data that is input or output during a data read operation is illustrated. Herein, the data read operation will be described in terms of one of various memory control signals, for example, a column address strobe signal /CAS.

During the read operation (READ) shown in FIG. 9, the column address strobe signal /CAS that is one memory control signal (portion (b) of FIG. 9) is output from the memory control unit synchronously with a clock CLK (portion (a) of FIG. 9). Furthermore, the column address strobe signal /CAS output from the memory control unit is held in a flip-flop or register in the interface unit. The memory control signal held in the flip-flop or register is output in, for example, one cycle of the clock and thus transmitted to an SDRAM (portion (c) of FIG. 9).

Assume that a latency required for the column address strobe signal /CAS by an SDRAM during the read operation (that is, CAS latency) is equivalent to three cycles of the clock. In this case, data DATA (portion (c) of FIG. 9) is output from the SDRAM in a delay time of "the CAS latency+1," that is, in four cycles of the clock after the memory control unit outputs a command.

In short, a memory control signal reaches a clock-locked SDRAM while being delayed by a flip-flop or register in the interface unit after output from the memory control unit. Moreover, the SDRAM does not start data transfer until the latency required by the SDRAM has elapsed since it received the memory control signal. The time required after the instant the memory control unit transmits the memory control signal until data read from the SDRAM is received or data is sent to the SDRAM agrees with the sum of "the latency+1."

FIG. 10 is a timing chart for explaining a write operation performed in the embodiment of a memory control system in accordance with the present invention. Shown is the relationship between a memory control signal output from the memory control unit and data that is input or output during a data write operation when the aforesaid interface unit (FIG. 6) is employed. The data write operation will be described in terms of one of various memory control signals, for example, a column address strobe signal /CAS.

During the write operation (WRITE) shown in FIG. 10, similarly to during the foregoing read operation, the column address strobe signal /CAS that is one memory control signal (portion (b) of FIG. 10) is output from the memory control unit synchronously with a clock CLK (portion (a) of FIG. 10). During the write operation, a latency required by a typical SDRAM (including the CAS latency) is zero. However, herein, the interface unit is employed. It is therefore necessary to wait for one cycle of the clock until data which is to be written is input to an SDRAM after a command is issued from the memory control unit (portions (c) and (d) of FIG. 10).

As mentioned above, according to the memory control system and memory control method of typical embodiments of the present invention, first, a memory control signal output from the memory control unit is held in the interface unit that operates synchronously with a clock. The memory control signal is sent in a given time. Moreover, a memory is accessed in consideration of a delay time required for the memory control signal to reach the memory. A memory space for a large storage capacity can therefore be realized by increasing the number of clock synchronous memories such as SDRAMs. Besides, a skew occurring between different memory control signals can be adjusted easily. Consequently, the memories such as SDRAMs can be accessed quickly and operate duly.

According to the memory control system and memory control method of typical embodiments of the present invention, second, the presence or absence of the interface unit is determined by designating an operation mode in which the memory control unit is established. Only when a large storage capacity structure composed of SDRAMs must be employed, is the interface unit used to improve the maximum driving capacity of the memory control unit. The interface unit that operates synchronously with a clock can be utilized more effectively.

What is claimed is:

1. A memory control system employing at least one clock synchronous memory which is controlled by and connected to a memory control unit, comprising:

an interface circuit, functioning as an output buffer synchronous with a clock so as to hold a memory control signal, which is output from said memory control unit in order to control said memory, and transmit the memory control signal in a predetermined time, wherein access to said memory is made in consideration of the delay time required for the memory control signal to reach said memory via said interface circuit, and wherein the memory control signal output from the memory control unit is transmitted to the at least one clock synchronous memory, via the interface circuit, while data output from the memory control unit is transmitted directly to the at least one clock synchronous memory.

2. A memory control system employing at least one clock synchronous memory which is controlled by a memory control unit, comprising:

an interface circuit functioning as an output buffer synchronous with a clock so as to hold a memory control signal, which is output from said memory control unit in order to control said memory, and transmit the memory control signal in a predetermined time, wherein access to said memory is made in consideration of the delay time required for the memory control signal to reach said memory via said interface circuit, and a facility capable of determining the presence or absence of said interface circuit for holding the memory control signal according to an operation mode in which said memory control unit is established, wherein the time required from a transmission of the memory control signal until a transfer of data can be selectively be defined as a latency required by said memory or defined as a sum of the latency required by said memory and the delay time caused by said interface circuit.

3. A memory control method for controlling at least one clock synchronous memory, wherein:

a memory control signal which is output from a memory control unit in order to control a memory is held in an interface circuit that operates synchronously with a clock, and sent to the memory in a predetermined time;

access to said memory is made in consideration of the delay time required for the memory control signal to reach said memory; and wherein the memory control signal output from the memory control unit is transmitted to the at least one clock synchronous memory, via the interface circuit, while data output from the memory control unit is transmitted directly to the at least one clock synchronous memory.

4. A memory control method for controlling at least one clock synchronous memories, wherein:

a memory control signal which is output from a memory control unit in order to control a memory is held in an interface circuit that operates synchronously with a clock, and sent to the memory in a predetermined time; and access to said memory is made in consideration of the delay time required for the memory control signal to reach said memory; and wherein the presence or absence of said interface circuit for holding the memory control signal is determined based on an operation mode in which said memory control unit is established, and the time required from a transmission of the memory control signal until a transmission or reception of data can be selectively be defined as a latency required by said memory or defined as a sum of the latency required by said memory and the delay time caused by said interface circuit.

* * * * *